United States Patent
England et al.

(10) Patent No.: US 12,199,003 B2
(45) Date of Patent: Jan. 14, 2025

(54) PACKAGING STACKED SUBSTRATES AND AN INTEGRATED CIRCUIT DIE USING A LID AND A STIFFENING STRUCTURE

(71) Applicant: Marvell Asia Pte Ltd, Singapore (SG)

(72) Inventors: Luke England, Lakeway, TX (US); Richard Stephen Graf, Gray, ME (US); Huahung Kao, San Jose, CA (US); Ronen Sinai, Yokneam Illit (IL)

(73) Assignee: Marvell Asia PTE Ltd., Singapore (SG)

( * ) Notice: Subject to any disclaimer, the term of this patent is extended or adjusted under 35 U.S.C. 154(b) by 416 days.

(21) Appl. No.: 17/400,149

(22) Filed: Aug. 12, 2021

(65) Prior Publication Data

US 2022/0051963 A1 Feb. 17, 2022

Related U.S. Application Data

(60) Provisional application No. 63/065,395, filed on Aug. 13, 2020.

(51) Int. Cl.
*H01L 21/48* (2006.01)
*H01L 23/00* (2006.01)
(Continued)

(52) U.S. Cl.
CPC ...... *H01L 23/3675* (2013.01); *H01L 21/4853* (2013.01); *H01L 21/4871* (2013.01);
(Continued)

(58) Field of Classification Search
CPC ............. H01L 23/3675; H01L 21/4853; H01L 21/4871; H01L 23/16; H01L 23/49838;
(Continued)

(56) References Cited

U.S. PATENT DOCUMENTS 6,979,782 B1 * 12/2005 Brodsky ............. H01L 21/4871
174/535
9,089,052 B2 * 7/2015 Li ........................ H01L 25/0655
(Continued)

OTHER PUBLICATIONS

Wacker Chemie AG, "Semicosil 993 TC—Thermal Interface Material/Thermally Conductive Silicone Adhesive", e-information leaflet, version 0.4, pp. 1-2, Feb. 15, 2017.
(Continued)

*Primary Examiner* — Benjamin Tzu-Hung Liu

(57) ABSTRACT

An electronic device disposed in a package that includes: an interposer, fan-out interconnect (FOI), and a lid. The interposer having first size and first surface upon which die terminals (DTs) are disposed and are configured to electrically couple to integrated circuit die (IC), and second surface upon which substrate terminals (STs) are disposed and are configured to electrically couple to substrate. The IC has second size smaller than the first size, and the IC is mounted on the first surface in electrical contact with the DTs, the interposer is mounted on third surface, and the package substrate has third size, larger than the first size. The FOI establishes electrical interconnection between DTs and STs, the DTs have first pitch size and the STs have second pitch size, larger than first pitch size. The lid has first section, configured to abut fourth surface, and second section, mounted on the third surface.

17 Claims, 5 Drawing Sheets

(51) Int. Cl.
*H01L 23/16* (2006.01)
*H01L 23/367* (2006.01)
*H01L 23/498* (2006.01)

(52) U.S. Cl.
CPC ........ *H01L 23/16* (2013.01); *H01L 23/49838* (2013.01); *H01L 23/562* (2013.01); *H01L 24/16* (2013.01); *H01L 2224/16227* (2013.01); *H01L 2924/1715* (2013.01); *H01L 2924/3511* (2013.01)

(58) Field of Classification Search
CPC ............... H01L 23/562; H01L 24/16; H01L 2224/16227; H01L 2924/1715; H01L 2924/3511
See application file for complete search history.

(56) References Cited

U.S. PATENT DOCUMENTS

| | | | |
|---|---|---|---|
| 2011/0031619 A1* | 2/2011 | Chen | H01L 21/563 257/737 |
| 2015/0021754 A1* | 1/2015 | Lin | H01L 24/19 438/122 |
| 2016/0126110 A1* | 5/2016 | Yang | H01L 23/49827 29/846 |
| 2017/0372979 A1* | 12/2017 | Gandhi | H01L 23/3675 |
| 2018/0145032 A1* | 5/2018 | Pu | H01L 21/76885 |
| 2021/0066265 A1* | 3/2021 | Eid | H01G 2/06 |

OTHER PUBLICATIONS

Ajico, "Ajinomoto Material Update—ww12, 2021", pp. 1-31 (related pp. 2-9—GL 102 product), year 2021.

Namics Corporation, "Namics Head Office/Factory—New Manufacturing Building Plan", pp. 1-18 (related p. 7-U8410-302 product), Jul. 2018.

Senju Metal Industry Co., "M705-LFAC19", Datasheet, pp. 1-11, Dec. 2004.

Ajinomoto Group, "Ajinomoto Build-up Film", pp. 1-15, year 2019-2020.

Wacker, "Thermally Conductive Gap Filler with 3 W/mK-Semicosil 962 TC", datasheet, pp. 1-2, year 2021.

Dow Corning Corporation, "Dow Corning SE 4450 Thermally Conductive Adhesive", product information, pp. 1-3, year 2008.

Namics Coproration, "Flip Chip Underfill", product information, pp. 1-5, year 2021.

* cited by examiner

PACKAGING STACKED SUBSTRATES AND AN INTEGRATED CIRCUIT DIE USING A LID AND A STIFFENING STRUCTURE

CROSS-REFERENCE TO RELATED APPLICATIONS

This application claims the benefit of U.S. Provisional Patent Application 63/065,395, filed Aug. 13, 2020, whose disclosure is incorporated herein by reference.

FIELD OF THE DISCLOSURE

The present invention relates generally to electronic devices, and particularly to methods and systems for packaging stacked substrates and an integrated circuit die.

BACKGROUND

Various techniques are known in the art for packaging electronic devices using interposers and circuit boards. Packages for large electronic devices incur various challenges, including cost effectively accommodating different pitch sizes of inputs and outputs (I/Os) of an integrated circuit and of a package substrate respectively, as well as maintaining suitable planarity and structural stability or stiffness.

The description above is presented as a general overview of related art in this field and should not be construed as an admission that any of the information it contains constitutes prior art against the present patent application.

SUMMARY

An embodiment of the present invention that is described herein provides an electronic device disposed in a package, the packaged includes an interposer, a fan-out interconnect, and a lid. The interposer having: (i) a first size and a first surface upon which die terminals are disposed and are configured to electrically couple to an integrated circuit die, and (ii) a second surface upon which substrate terminals are disposed and are configured to electrically couple to a substrate. The integrated circuit die has a second size that is smaller than the first size, and the integrated circuit die is mounted on the first surface of the interposer in an electrical contact with the die terminals, and the interposer is mounted on a third surface of a package substrate, and the package substrate has a third size, that is larger than the first size. The fan-out interconnect establishing an electrical interconnection between the die terminals on the first surface and the substrate terminals on the second surface, the die terminals have a first pitch size and the substrate terminals have a second pitch size, which is larger than the first pitch size. The lid has: (i) a first section, which is configured to abut a fourth surface of the integrated circuit die when the lid is mounted, and (ii) a second section, which is mounted on the third surface of the substrate.

In some embodiments, the interposer includes an Ajinomoto build-up film (ABF) substrate, and one or more vias formed through the ABF substrate and configured to electrically connect between the integrated circuit die and the substrate. In other embodiments, the lid includes copper, which is plated with a layer of nickel, and is configured to spread heat that is generated when powering the integrated circuit die. In yet other embodiments, the electronic device includes a layer of thermal interface material (TIM) disposed between the first section and the fourth surface and establish contact therebetween, the TIM being configured to transfer heat between the integrated circuit die and the first section.

In an embodiment, the lid has a third section connecting between the first and second sections. In another embodiment, the third section has a linear shape, and a circumference of the package has a trapezoid-shaped cross-section. In yet another embodiment, the electronic device includes a stiffening structure, which is disposed between the first surface and the lid, the stiffening structure being configured to mechanically couple the interposer and the lid to one or more of: (i) mechanically stiffen the package, (ii) reduce a warpage of the interposer, and (iii) reduce a warpage of the package substrate.

In some embodiments, the stiffening structure surrounds the integrated circuit die. In other embodiments, a surface of the stiffening structure is flush with the fourth surface of the integrated circuit die.

In an embodiment, the stiffening structure has a ring shape, which is configured to surround the integrated circuit die. In another embodiment, the stiffening structure has a rectangular shape, which is configured to surround the integrated circuit die.

In some embodiments, the stiffening structure is coupled to at least one of the first surface and the lid using an adhesive substance. In other embodiments, the lid is coupled to the third surface of the package substrate using an adhesive substance.

There is additionally provided, in accordance with an embodiment of the present invention, a method for packaging an electronic device, the method including mounting an integrated circuit die on an interposer having: (i) a first size and a first surface upon which die terminals are disposed for electrically coupling to the integrated circuit die, and (ii) a second surface upon which substrate terminals are disposed for electrically coupling to a substrate, the integrated circuit die has a second size that is smaller than the first size, the integrated circuit die is mounted on the first surface of the interposer in an electrical contact with the die terminals, the interposer is mounted on a third surface of a package substrate, and, the package substrate has a third size, that is larger than the first size. A lid having: (i) a first section, for abutting a fourth surface of the integrated circuit die when the lid is mounted, and (ii) a second section, which is mounted on the third surface of the substrate, is fabricated.

In some embodiments, the method includes producing a fan-out interconnect for establishing an electrical interconnection between: (i) the die terminals on the first surface, and (ii) the substrate terminals on the second surface, the die terminals have a first pitch size and the substrate terminals have a second pitch size, which is larger than the first pitch size. In other embodiments, the method includes disposing, between the first section and the fourth surface, a layer of thermal interface material (TIM) for establishing contact therebetween and for transferring heat between the integrated circuit die and the first section. In yet other embodiments, fabricating the lid includes producing a third section of the lid for connecting between the first and second sections.

In an embodiment, the method includes disposing, between the first surface and the lid, a stiffening structure, for performing one or more of: (i) mechanically stiffening the package, (ii) reducing a warpage of the interposer, and (iii) reducing a warpage of the package substrate. In another embodiment, disposing the stiffening structure comprises disposing the stiffening structure around the integrated circuit die. In yet another embodiment, the method includes producing an additional fan-out interconnect for establishing an electrical interconnection between (i) the substrate terminals on the second surface, and (ii) the third surface of the substrate.

There is further provided, in accordance with an embodiment of the present invention, a method for packaging an electronic device, the method including mounting an interposer having: (i) a first size, (ii) a first surface, (iii) and a second surface opposite the first surface, on a third surface of a substrate having a second size, larger than the first size. An integrated circuit die is mounted on the first surface, the integrated circuit die having: (i) a fourth surface facing the first surface, and (ii) a fifth surface opposite the fourth surface, and the integrated circuit die has a third size, smaller than the first size. A lid, having first and second sections is fabricated, and: (i) the first section is coupled to the fifth surface of the integrated circuit die, and (ii) the second section is coupled to the third surface of the substrate.

In some embodiment, the interposer has: (i) die terminals that are disposed between the first surface and the fourth surface, and that are confined within a first footprint defined by the third size, the die terminals have a first pitch size for electrically connecting between the interposer and the integrated circuit die, and (ii) substrate terminals that are disposed between the second and third surfaces, and that are confined within a second footprint defined by the first size, the substrate terminals have a second pitch size, which is larger than the first pitch size, for electrically connecting between the interposer and the substrate, and the method includes, producing a fan-out interconnect for establishing an electrical interconnection between at least one of the die terminals that is confined within the first footprint and at least one of the substrate terminals that is disposed out of the first footprint.

In other embodiments, producing the fan-out interconnect includes producing: (i) a first electrical conductor, which is connected to the at least one of the die terminals, and is extended out of the first footprint, and (ii) a second electrical conductor, which is connected to at least one of the substrate terminals, and is extended out of the second footprint.

The present disclosure will be more fully understood from the following detailed description of the embodiments thereof, taken together with the drawings in which:

DETAILED DESCRIPTION OF EMBODIMENTS

Figure 1:
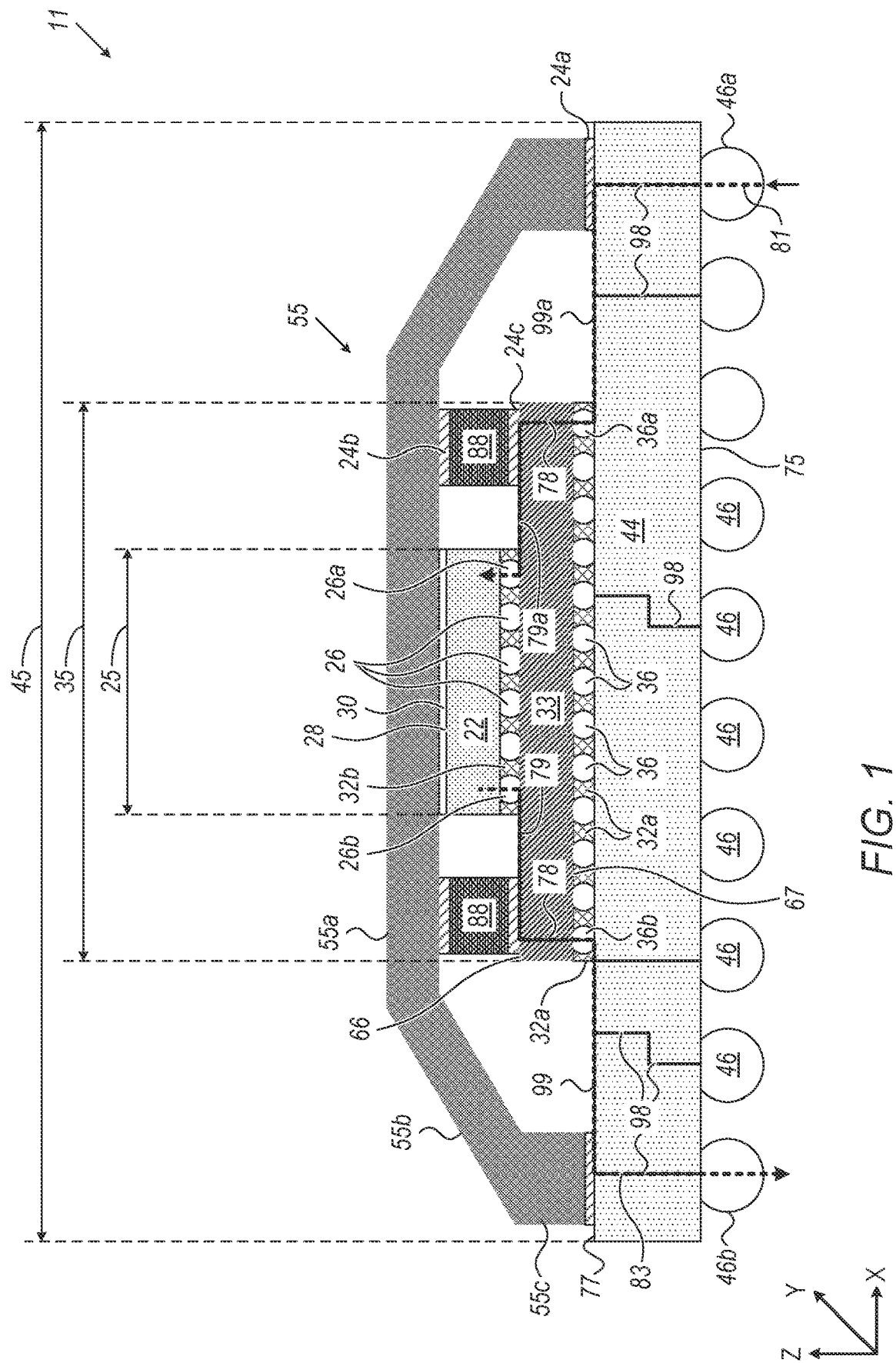
FIG. 1 is a schematic sectional view of a packaged electronic device having an integrated circuit (IC) die and stacked substrates, in accordance with an embodiment that is described herein.

Electronic products typically have one or more electronic devices that are packaged so as to be coupled to respective sockets of the product using various techniques. Some packaging techniques include disposing within the package an interposer between an integrated circuit (IC) die and a circuit board (CB). The package typically has (i) die terminals (e.g., bumps having a first pitch size) for interconnecting between the IC die and the interposer, and substrate terminals (e.g., bumps having a second pitch size, larger than the first pitch size) for interconnecting between the interposer and the substrate. The substrate may have interconnects, such as a ball-grid array (BGA), for interconnecting the substrate with the socket of the electronic product. The BGA typically has a third pitch size larger than the aforementioned first and second pitch sizes. Moreover, the size of the substrate is typically substantially larger than the size of the IC die.

Note that each of the aforementioned interconnects comprises a pattern, of interleaved bumps and spaces, such that each space separates between each pair of adjacent bumps. In the context of the present disclosure and in the claims, the term "pitch" refers to a pair of a bump (or a ball of the BGA) and an adjacent space, and the term "pitch size" refers to the accumulated size of one bump and one adjacent space. Moreover, the terms "about" or "approximately" for any numerical values or ranges indicate a suitable dimensional tolerance that allows the part or collection of components to function for its intended purpose as described herein.

The large difference in pitch size between the bumps of the IC die and BGA of the substrate causes a difficulty in transferring signals therebetween. In principle, it is possible to form fan-out interconnects between the IC die and the interposer, so as to interconnect between the die terminals and the substrate terminals. Such fan-out interconnects, however, cannot compensate for the large difference in pitch size, due to various limitations related to signal integrity, and other sorts of limitations. Moreover, this configuration requires an interposer having a size similar to that of the substrate, which substantially increases the cost of the package.

Embodiments of the present disclosure that are described herein, provide techniques for improving the electrical performance and cost-effectiveness of packaging large electronic devices (e.g., having a packaging size larger than about 75 mm), by integrating within the package stacked substrates with two levels of fan-out interconnects, a lid, and a stiffening structure, which are all described herein.

In some embodiments, the package of the electronic device comprises an IC die, such as but not limited to a processor, an application-specific integrated circuit (ASIC), or a network switch, also referred to herein as IC for brevity. The IC has die terminals for electrically connecting therebetween. In the present example, the die terminals comprise bumps having a pitch size of about 130 µm. In some embodiments, the IC is mounted on an interposer made from an Ajinomoto Build-up Film (ABF) substrate described in detail in FIG. 1 below. The ABF-based interposer comprises electrically-conductive traces, e.g., made from copper. The ABF structure enables patterning the thin copper traces using very large-scale integration (VLSI) processes, such as photolithography and plasma etching. In such embodiments, a designer of the package can define any suitable width of the copper traces, which allows various routing schemes of signals conducted within the package.

In some embodiments, the interposer has: (i) a first surface, which is typically planar (e.g., having a planarity of about 100 µm peak to peak or any other suitable planarity metric), and facing the IC, and (ii) a second surface, which is opposing the first surface and having about the same planarity. The second surface is facing a substrate, in the present example a printed circuit board (PCB) described in detail in FIG. 1 below. The package comprises substrate interconnects, which are disposed between the interposer and a surface of the substrate, also referred to herein as a third surface. In the present example, the substrate interconnects may comprise solder bumps having a pitch size between about 400 µm and 500 µm, for interconnecting between the interposer and the substrate.

In some embodiments, the package comprises balls of a BGA having a pitch size of about 1000 µm, which are disposed between the substrate and a socket of the electronic product and are configured to transfer signals between the substrate and entities external to the package of the electronic device. In other embodiments, the balls of the BGA can also be used to directly join to a PCB of the electronic product via reflow.

In some embodiments, the package comprises a first set of fan-out interconnects, which typically are patterned in the interposer and are configured to interconnect between the copper bumps (having the 130 µm pitch size) and the solder bumps (having the 400 µm-500 µm pitch size). The first set of fan-out interconnect also comprises one or more traces, which are patterned in the first surface of the interposer, and are configured to interconnect between a given copper bump confined within the footprint of the IC, and a given solder bump that is typically positioned out of the footprint of the IC. Similarly, the package comprises a second set of fan-out interconnects, which are typically patterned in the surface of the substrate (i.e., the third surface), and are configured to interconnect between a given solder bump confined within the footprint of the interposer, and a given ball of the BGA that is typically positioned out of the footprint of the interposer. The fan-out interconnects are described in more detail in the detailed description of FIG. 1.

In some embodiments, the package comprises a lid, which is made from copper plated with a layer of nickel or other suitable heat transferring metallic material and is configured to transfer heat away from a specified hot component of the package described herein. In the present example, the lid has (i) a first section, which is coupled to the top surface of the IC, (ii) a second section mounted on the third surface of the substrate, and (iii) a third section connecting between the first and second sections. The package further comprises a layer of thermal interface material (TIM) disposed between the first section of the lid and the top surface of the IC. During the operation of the electronic product, the IC is powered on and generates heat. In some embodiments, the TIM and the first section of the lid are configured to dissipate the generated heat away from the IC. More specifically, the TIM transfers the heat between the IC and the first section of the lid, which dissipates the heat away from the package.

In some cases, mechanical forces and/or forces induced by thermal cycles may be applied to one or more components of the package and may cause malfunctioning of the electronic device. In some embodiments, the package comprises a stiffening structure, which is disposed between the first surface and the lid and typically, but not necessarily, surrounds the IC. The stiffening structure is configured to improve the mechanical stiffness of the package, e.g., by fixing the lid to the interposer.

In the present, non-limiting, example, the IC has a coefficient of thermal expansion (CTE) of about 3, the interposer has a CTE of about 6 and the substrate has a CTE of about 11. During the operation of the electronic device, the IC is powered on and generates heat in thermal cycles corresponding to the power supplied to the IC. Such thermal cycles may induce stress between the IC and interposer, and/or between the interposer and the substrate. The thermal-induce stress may result in warpage of the interposer and/or substrate. In some embodiments, the stiffening structure is configured to reduce at least the warpage-level of the interposer, by providing the package with a mechanical support, which is depicted in detail in FIG. 1 below.

The disclosed techniques improve the quality of signals routed in the package based on the embodiments described above, and reduce the cost associated with packaging electronic device having large-sized ICs (e.g., about 30 mm or larger) and small pitch size (e.g., about 130 µm or smaller) of the die interconnects.

The description above is presented as a general overview of embodiments of the present disclosure, which are described in detail herein.

FIG. 1 is a schematic sectional view of a packaged electronic device 11 having an integrated circuit (IC) die, referred to herein as IC 22, and a stack of an interposer 33 and a substrate 44, in accordance with an embodiment that is described herein.

In the present example, the sectional view is shown in an XZ plane of an XYZ coordinate system. Moreover, in the context of the present disclosure, the package of electronic device 11 is also referred to herein as a device 11, for brevity.

In some embodiments, IC 22 is flipped using any suitable flip chip process known in the art so that the active area of IC 22 is facing interposer 33 and the substrate of IC 22 is typically made from silicon, and has a surface 28.

In some embodiments, device 11 comprises die terminals, referred to herein as bumps 26, 26a and 26b, which are made from any suitable material, such as but not limited to copper that may have other suitable elements such as but not limited to tin (Sn) and Silver (Ag). In the context of the present disclosure, the term bumps 26 refers to one or all bumps 26, 26a and 26b. Bumps 26 have a typical width (e.g., along X and Y axes) between about 60 µm and 90 µm and a typical height of about 60 µm (e.g., along Z axis) or any other suitable size, and are configured to electrically connect between IC 22 and interposer 33. Each pair of bumps 26 is separated by an opening, also referred to herein as a space, filled with a suitable layer 32b, also referred to herein as underfill layer, made from an epoxy-based polymer with suitable additives. In the present non-limiting example layer 32b comprises a XS8410-302SNS3 product supplied by NAMICS Corporation (3993 Nigorikawa, Kita-ku, Niigata, Japan). In some embodiments, layer 32b is configured serve as a stress barrier for distributing mechanical stress applied to bumps 26 uniformly to all bumps 26, and to provide bumps 26 with a mechanical support that prevents warpage or breaking of one or more bumps 26. In some embodiments, a pair of bumps 26 and an adjacent filled space has together a pitch size of about 130 µm, or any other suitable pitch size.

In some embodiments, flipped IC 22 and bumps 26 are mounted on a typically planar surface 66 of interposer 33, in the present example surface 66 has a planarity of about 100 µm peak to peak. Interposer 33 has a surface 67, which is opposite surface 66, has about the same planarity, and faces substrate 44 described in detail below. In some embodiments, the package of device 11 comprises substrate interconnects, in the present example, solder bumps 36, 36a and 36b or any other suitable type of bumps or balls having a pitch size between about 400 μm and 500 μm. In the context of the present disclosure, the terms solder bumps 36 and/or bumps 36 refer to one or all bumps 36, 36a and 36b. One example solder paste used for producing solder bumps 36 is selected from the M705 family of products supplied by Senju Metal Industry Co. (SMIC) (Adachi-ku, Tokyo, Japan), but any other suitable solder paste product of any other supplier may be used. Solder bumps 36 are disposed between surface 67 of interposer 33 and a surface 77 of substrate 44, and the spaces between adjacent solder bumps 36 is filled by a layer 32a. Layer 32a is also referred to herein as an underfill layer, and has, mutatis mutandis, the same functionality and material structure of layer 32b described above. Solder bumps 36 are configured for interconnecting between interposer 33 and substrate 44 and for transferring signals therebetween. In some embodiments, interposer 33 is made from an Ajinomoto Build-up Film (ABF) substrate comprising a three-layer polymer system, with a polyethylene terephthalate (PET) support film, a resin layer, and a cover film. In the present non-limiting example the ABF substrate of interposer 33 is made from GL102 product, provided by Ajinomoto Group (Chuo City, Tokyo, Japan).

In some embodiments, interposer 33 comprises electrical conductors, in the present example interconnecting vias 78 and traces 79 made from copper or any other suitable electrically-conductive material or alloy. Note that the ABF substrate of interposer 33 enables patterning of copper vias 78 and traces 79, using very large-scale integration (VLSI) processes, such as photolithography and plasma etching. The VLSI processes enable the production of thin copper vias 78 and/or traces 79 e.g., having a width smaller than about 12 μm or any other suitable width. The VLSI processes provide improved control in patterning traces compared to processes used for producing printed circuit boards (PCBs), thus, a designer of the package can define any suitable width of copper vias 78 and traces 79, which allows any suitable routing scheme of signals conducted within the package of device 11. Additional embodiments related to vias 78 and traces 79 are described in more detail below.

In some embodiments, substrate 44 comprises a prepreg-based high-density interconnector printed circuit board (HDI PCB), or any other suitable type of a circuit board (CB). The term "prepreg" refers to a dielectric material that is sandwiched between two cores or between a core and a copper foil formed in the PCB. The package of device 11 comprises an array of interconnects, in the present example, a ball-grid array (BGA) having balls 46, 46a and 46b formed on a surface 75 of substrate 44, and therefore, disposed between surface 75 and a socket (not shown) of the electronic product comprising device 11. In the present example, balls 46 have a pitch size of about 1000 μm and are configured to transfer signals between substrate 44 and one or more entities external to the package of electronic device 11.

In some embodiments, IC 22 has a size 25, e.g., about 30 mm by 30 mm (or any other suitable size or shape, e.g., a rectangle), defining a footprint of about 900 mm$^2$. Interposer 33 has a size 35, e.g., about 50 mm by 50 mm (or any other suitable size or shape, e.g., a rectangle), defining a footprint of about 2,500 mm$^2$, which is larger than the footprint defined by size 25. Substrate 44 has a size 45, e.g., about 100 mm by 100 mm (or any other suitable size or shape, e.g., a rectangle), defining a footprint of about 10,000 mm$^2$, which is larger than the footprint defined by size 35. Note that bumps 26 are confined within the footprint of IC 22, which is defined by size 25. Solder bumps 36 are confined within the footprint of interposer 33, which is defined by size 35, and balls 46 are confined within the footprint of substrate 44, which is defined by size 45. Note that at least one of solder bumps 36 is disposed out of the footprint of IC 22, and at least one of balls 46 is disposed out of the footprint of interposer 33, as shown in FIG. 1. Moreover, due to limitations in the PCB process technology, the pattern density of about 130 μm pitch size of bumps 26 cannot be produced in substrate 44. Moreover, the electrical currents specified to be conducted by each ball 46 are substantially larger than the electrical currents specified to be conducted by bumps 26, and therefore, balls 46 are typically larger than bumps 26 (and also larger than solder bumps 36). In some embodiments, in order to conduct the specified amount of electrical signals to and from IC 22, and to overcome the footprint limitation described above, the electrical traces of the package of device 11 comprises fan-out interconnects that extend out of the footprint of IC 22 and/or interposer 33, as described in detail below.

In some embodiments, the package of electronic device 11 comprises first and second sets of fan-out interconnects, which are implemented in interposer 33 and in substrate 44, respectively. In an embodiment, the first set of fan-out interconnects comprises electrical conductors, in the present example copper traces 79 and 79a, which are patterned, e.g., in or on surface 66 of interposer 33, and are configured to expand the routing of the signals in XY plane of the XYZ coordinate system, beyond (i.e., out of) the footprint of IC 22. For example, copper trace 79a has one edge connected to bump 26a that is confined within the footprint of IC 22, however, copper trace 79a is also extended out of the footprint of IC 22 for obtaining the fan-out interconnection, e.g., between copper bump 26a and solder bump 36a. Copper vias 78 (also referred to herein as via interconnects), which are configured to conduct the signals between surfaces 66 and 67 of interposer 33.

In some embodiments, the second set of fan-out interconnects comprises additional electrical conductors, in the present example copper traces 99 and 99a, which are patterned, e.g., in or on surface 77 of substrate 44, and are configured to expand the routing of the signals in the XY plane, beyond the footprint of interposer 33. For example, copper trace 99a has one edge connected to solder bump 36a that is confined within the footprint of interposer 33, however, copper trace 99a is also extended out of the footprint of interposer 33 for obtaining the fan-out interconnection, e.g., between solder bump 36a and ball 46a.

In some embodiments, copper vias 98 serve as via interconnects (also referred to herein as through vias), which are configured to conduct the signals between surfaces 77 and 75 of substrate 44. For example, an input signal is routed into IC 22 along a dashed line 81. The input signal is routed from ball 46a, through copper vias 98 and traces 99a, solder bump 36a, via 78 copper trace 79a, and bump 26a. Similarly, an output signal is routed from IC 22, along a dashed line 83, to an entity external to device 11. The output signal is conducted via bump 26b, copper via 78, copper trace 79, solder bump 36b, copper via 98, copper trace 99, and ball 46b. Note that some of the signals routed between IC 22 and the entities external to the package of device 11, may be conducted solely through copper vias 78 and 98, without conducting signals using the fan-out interconnects, such as copper traces 79, 79a, 99 and 99a. Yet, the fan-out interconnects increase the routing options of the signals, and therefore, increase the input/output data rate of electronic device 11. Moreover, the fan-out interconnects may reduce the susceptibility of electronic device 11 to electromagnetic (EM) interference and other sorts of interferences. Note that the routing of signal in electronic device 11 is improved by using interposer 33 and having two levels of fan-out interconnects (e.g., traces 79, and 79a, and traces 99 and 99a) that extend the routing of signals in the XY plane beyond the footprint of IC 22 and interposer 33.

During the operation of electronic device 11, IC 22 is powered up, and responsively, generates heat. In some embodiments, the package of device 11 comprises a lid 55, which is made from a thermally-conductive material, such as copper plated with a layer of nickel, or other suitable heat transferring material (instead of or in addition to one or both of the copper and nickel), and is configured to transfer the generated heat away from IC 22. In the present example, lid 55 has a first section 55a, which is positioned on top of surface 28 of IC 22 for covering and placing in contact with IC 22, in other words section 55a is configured to abut surface 28 of IC 22. The package of device 11 further comprises a layer of thermal interface material (TIM), referred to herein as TIM 30, which is disposed between first section 55a and surface 28 of IC 22, and is configured to couple between section 55a and surface 28 and to improve the heat dissipation from IC 22 to lid 55. In the present non-limiting example, TIM 30 is based on a 993-TC product supplied by Wacker Chemie AG (Munich, Germany) and the product is based on a matrix of Polymethylsiloxane and other suitable polymers and has zinc oxide embedded within the matrix and other additives for obtaining improved thermal conductivity.

In some embodiments, lid 55 has a second section 55c, which is mounted on surface 77 of substrate 44, and a third section 55b connecting between sections 55a and 55c. In some embodiments, section 55c is coupled to surface 77 of substrate 44 using a layer 24a made from any suitable type of thermally-conductive adhesive material (substance), such as but not limited to SE4450 product supplied by Dow Corning Corporation (Midland, Michigan). In some embodiments, section 55b of lid 55 has a linear shape, as shown in the example of FIG. 1. In such embodiments, the circumference of the package of device 11 has a trapezoid-shaped cross-section, such that substrate is the large base, section 55a is the small base (typically parallel to substrate 44) and section 55b serves as the slanted legs of the trapezoid.

In other embodiments, the cross section of the package of device 11 may have any other shape of a polygon (e.g., in case section 55a and substrate 44 are not parallel with one another), or any other shape, e.g., in case section 55b has a non-linear shape. In alternative embodiments, lid 55 may be attached to surface 77 using any other suitable coupling technique.

In some cases, various mechanical forces and/or forces induced by thermal cycles may be applied to one or more components of the package of device 11. Such forces may cause malfunctioning and/or reliability problems in the performance or functionality of electronic device 11. In some embodiments, the package of device 11 comprises a stiffening structure 88, which is disposed between the surface 66 of interposer 33 and lid 55 and typically surrounds IC 22. Note that stiffening structure 88 may surround IC 22 using a circular geometry whose axes are defined based on the size of IC along X and Y axes, or a polygon such as a square (i.e., having a square shape) or a rectangle (i.e., having a rectangular shape), or any other suitable shape. In case the size of IC 22 is about 30 mm by 30 mm the top-view shape of stiffening structure 88 may be a circle (e.g., having a ring shape) or a square (i.e., having a square shape) that are sufficiently large to surround IC 22. In case the size of IC 22 is about 25 mm by 35 mm the top-view shape of stiffening structure 88 may be an ellipse or a rectangle that are sufficiently large to surround IC 22. In other embodiments, stiffening structure 88 may have multiple sections separated from one another using any suitable material. In other words, the pattern of stiffening structure 88 may be continuous or non-continuous.

In the present example, stiffening structure 88 is coupled to section 55a and surface 66 using layers 24b and 24c, respectively. In an embodiment, at least one of and typically both layers 24b and 24c are made from the same adhesive material (substance) of layer 24a described above. In some embodiments, stiffening structure 88 is configured to improve the mechanical stiffness of the package of device 11, e.g., by fixing lid 55 to interposer 33.

In other embodiments, at least one of stiffening structure 88 and lid 55 may have any other suitable shape that provides the aforementioned mechanical support and resistance to warpage of interposer 33 described below.

In the present example, IC 22, which comprises a silicon substrate has a coefficient of thermal expansion (CTE) of about 3. Interposer 33, which has the aforementioned ABF substrate, has a CTE of about 6, and substrate 44 has a CTE of about 11. During the operation of electronic device 11, the heat generated by IC 22 increases the temperature of electronic device 11, whereas when IC 22 is idle or receives a minimal power, e.g., in a standby mode, the temperature of device 11 decreases. Such thermal cycles (increase and decrease of temperatures) and the large different in the CTE of IC 22, interposer 33 and substrate 44, may cause warpage in the package, for example, between IC 22 and interposer 33, and/or between interposer 33 and substrate 44. In some embodiments, stiffening structure 88 is configured to reduce at least the warpage of interposer 33, by providing the package of device 11 with a mechanical support.

In some embodiments, the combination of lid 55 and stiffening structure 88 improves the mechanical stiffness of the package of device 11, and also improves the durability of the package against stress induced by the thermal cycle described above. Note that copper bumps 26 receive a mechanical support from layer 32b and from stiffening structure 88 bonded to lid 55 and interposer 33 by layers 24b and 24c. Moreover, solder bumps 36 receive a mechanical support from layer 32a and from lid 55 coupled to substrate 44 by layer 24a. In such embodiments, lid 55 receives the mechanical support from stiffening structure 88, and section 55b that is typically flexible may serve as a buffer or a stress relief apparatus in order to compensate for the mechanical and/or thermally-induced stresses described above.

In some embodiments, the upper surface of stiffening structure 88 on which layer 24b is disposed, is typically flush with surface 28 of IC 22. In such embodiments, TIM 30 and layer 24b have a similar thickness in order to retain section 55a flat and parallel to surface 28. In other embodiments, the upper surface of stiffening structure 88 is not flush with surface 28, so that TIM 30 and layer 24b have a thickness different from one another, so as to retain section 55a flat and parallel to surface 28. In both embodiments, the upper surfaces of TIM 30 and layer 24b are typically flush with one another.

In other embodiments, instead of solder bumps 36, the package of electronic device may comprise balls of a BGA, which has the same pitch size of solder bumps 36 but may have a different chemical composition or structure and may be produced using any suitable process that may be different from the process for producing solder bumps 36.

This particular configuration of the package of electronic device 11 is shown by way of example, in order to illustrate certain problems that are addressed by embodiments of the present invention and to demonstrate the application of these embodiments in enhancing the performance of such an electronic device. Embodiments of the present invention, however, are by no means limited to this specific sort of example package configuration, and the principles described herein may similarly be applied to other sorts of packages of any suitable type of electronic or electro-optic devices.

Figure 2:
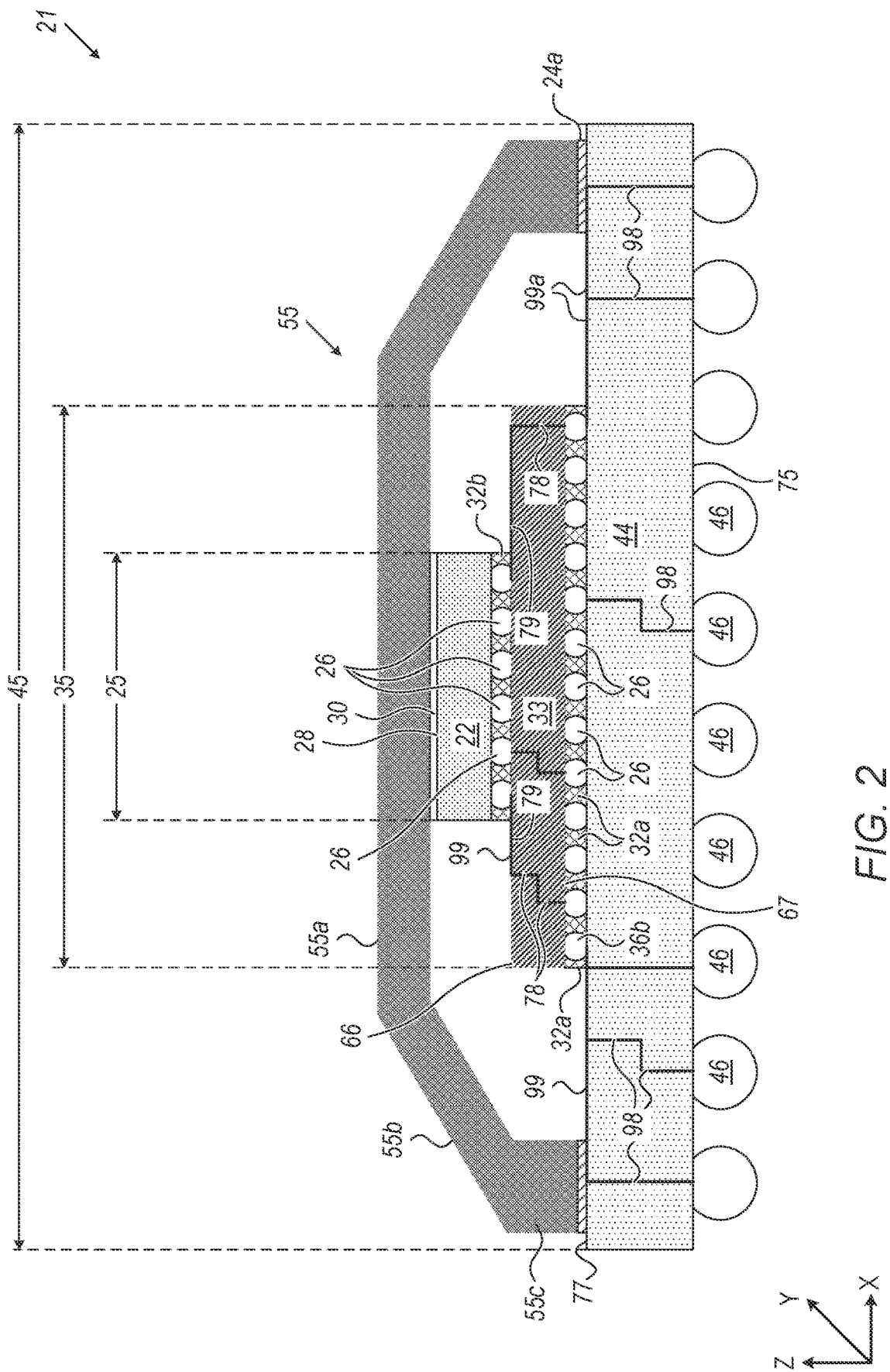
FIG. 2 is a schematic sectional view of a packaged electronic device having an IC die and stacked substrates, in accordance with another embodiment that is described herein.

FIG. 2 is a schematic sectional view of a packaged electronic device 21 having IC 22 and the stack of interposer 33 and substrate 44, in accordance with another embodiment that is described herein.

In some embodiments, the package of electronic device 21 has the same features of the package of electronic device 11 of FIG. 1 above, but stiffening structure 88 and layers 24b and 24c are removed from the configuration of electronic device 21. In some cases, the mechanical and/or thermally-induced stresses described in FIG. 1 above are sufficiently-small, so that stiffening structure 88 is not required, and the configuration of device 21 (without stiffening structure 88) is sufficient to overcome these stresses. In some embodiments, the configuration difference between electronic devices 11 and 21 may result in different process sequences for producing devices 11 and 21. In other embodiments, the configurations of devices 11 and 21 are defined by constraints related to the process specified thermal budget the process flow for producing the package of electronic devices 11 and 21, as will be described in FIGS. 3 and 4 below.

In other embodiments, stiffening structure 88 may be implemented in the package of electronic device using any suitable configuration, such as but not limited to the configuration of electronic device 11 depicted in FIG. 1 above.

This particular configuration of the package of electronic device 21 is shown by way of example, in order to illustrate certain problems that are addressed by embodiments of the present invention and to demonstrate the application of these embodiments in enhancing the performance of such an electronic device. Embodiments of the present invention, however, are by no means limited to this specific sort of example package configuration, and the principles described herein may similarly be applied to other sorts of packages of any suitable type of electronic or electro-optic devices.

Figure 3:
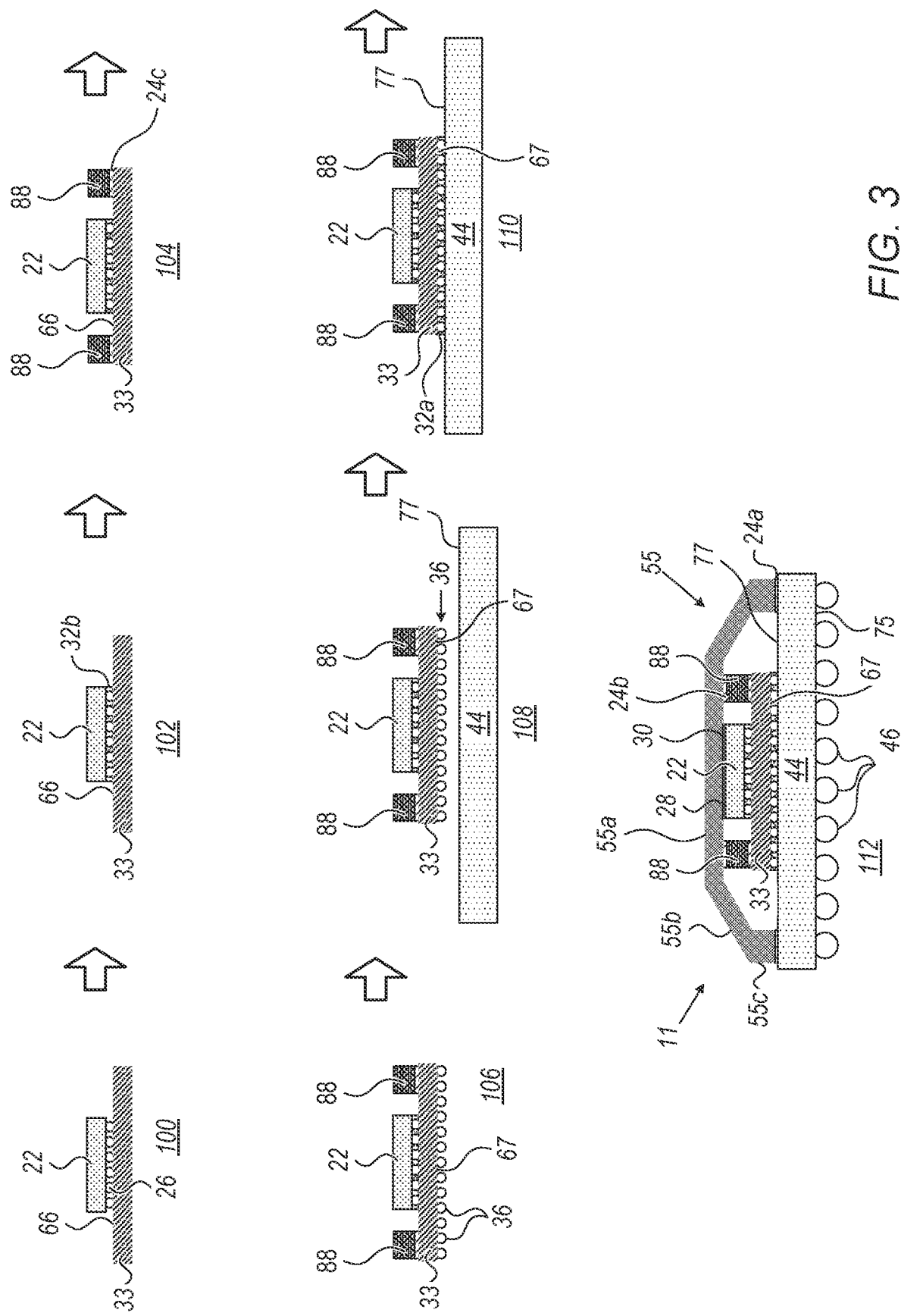
FIG. 3 is a diagram that schematically illustrates a sectional view of a process sequence for packaging the electronic device of FIG. 1, in accordance with an embodiment that is described herein.

FIG. 3 is a diagram that schematically illustrates a sectional view of a process sequence for packaging electronic device 11, in accordance with an embodiment that is described herein.

The process begins at an operation 100 with coupling IC 22, which is flipped and has bumps 26, to surface 66 of interposer 33 that already has copper vias 78 and traces 79 (shown in FIGS. 1 and 2 above). The coupling between bumps 26 and surface 66 of interposer 33 is carried out using any suitable coupling technique, such as bonding using mass reflow or thermocompression bonding.

At an operation 102, layer 32b whose functionality and material composition are described in FIG. 1 above, is disposed between IC 22 and interposer 33. At an operation 104, layer 24c and stiffener structure 88 are attached (e.g., bonded) to surface 66 of interposer 33, as described in FIG. 1 above. Note that typically layer 24c, which comprises a suitable thermally-conductive adhesive material, is disposed on surface 66, and subsequently, stiffener structure 88 is bonded on layer 24c.

At an operation 106, solder bumps 36 are formed on surface 67 of interposer 33, using any suitable production method. In some embodiments, solder bumps 36 are formed by applying a suitable material, such as a tacky flux, to surface 67, and placing solder bumps 36 on traces (e.g., pads) formed on surface 67. In other embodiments, solder bumps 36 are formed on surface 67 of interposer 33, using the solder paste described in FIG. 1 above, which is patterned and shaped (e.g., using a reflow process) to obtain the specified shape and size of solder bumps 36.

At an operation 108, solder bumps 36 are coupled to surface 77 of substrate 44 using any suitable bonding process. Note that in the example of the process flow of FIG. 3, via(s) 98 and copper traces 99 and 99a (shown in FIGS. 1 and 2 above) are already produced in advance within substrate 44, as described in FIG. 1 above. In other embodiments, at least traces 99 and 99a are produced on surface 77, before coupling between solder bumps 36 and conductive traces 99 and 99a. At an operation 110, layer 32a that serves as the aforementioned underfill layer for mechanically supporting solder bumps 36, as described in FIG. 1 above, is disposed between (i) surface 67 of interposer 33, and (ii) surface 77 of substrate 44.

In other embodiments, layer 32a may not be required, so that operation 110 may be eliminated from the method. The need for layer 32a depends on the size of solder bumps 36 and the conditions and application of the electronic device.

At an operation 112 that concludes the process sequence of FIG. 3, (i) TIM 30 is disposed on surface 28 of IC 22, (ii) layer 24a is disposed on surface 77 of substrate 44, and (iii) layer 24b, which is made from an adhesive substance, is disposed on stiffener structure 88. Subsequently, lid 55 is coupled to the package of electronic device 11 by coupling section 55a with TIM 30 and layer 24b, and by coupling between section 55c and layer 24a.

In other embodiments, TIM 30 and layer 24b are disposed on section 55a, and layer 24a is disposed on section 55c, and subsequently, lid 55 is bonded to stiffener structure 88 and surfaces 28 and 77. In alternative embodiments, lid 55 is placed over stiffener structure 88 and surfaces 28 and 77, and subsequently, TIM 30, and layers 24a and 24b are disposed for bonding between the aforementioned elements.

In some embodiments, balls 46 of the BGA are coupled to surface 75 of substrate 44, as described in FIG. 1 above. Note that in the process sequence of FIG. 3, IC 22 and interposer 33 are attached together, and subsequently, substrate 44 is coupled thereto. In some cases one or more of operations 100-106 may cause a distortion in interposer 33, which may result insufficient planarity in warped surfaces 66 and 67. In some embodiments, stiffener structure 88 is configured to overcome this problem by serving as a stress barrier as described in detail in FIG. 1 above.

In other embodiments, the process sequence may comprise one or more additional process operations, such as the patterning of the fan-out interconnects, such as vias 78 and 98 and copper traces 79, 79a, 99 and 99a described in detail in FIG. 1 above. In such embodiments, via 78 and traces 79, and 79a may be produced using VLSI processes, and via 98 and traces 99 and 99a may be produced using any suitable processes for patterning layers in PCBs.

Figure 4:
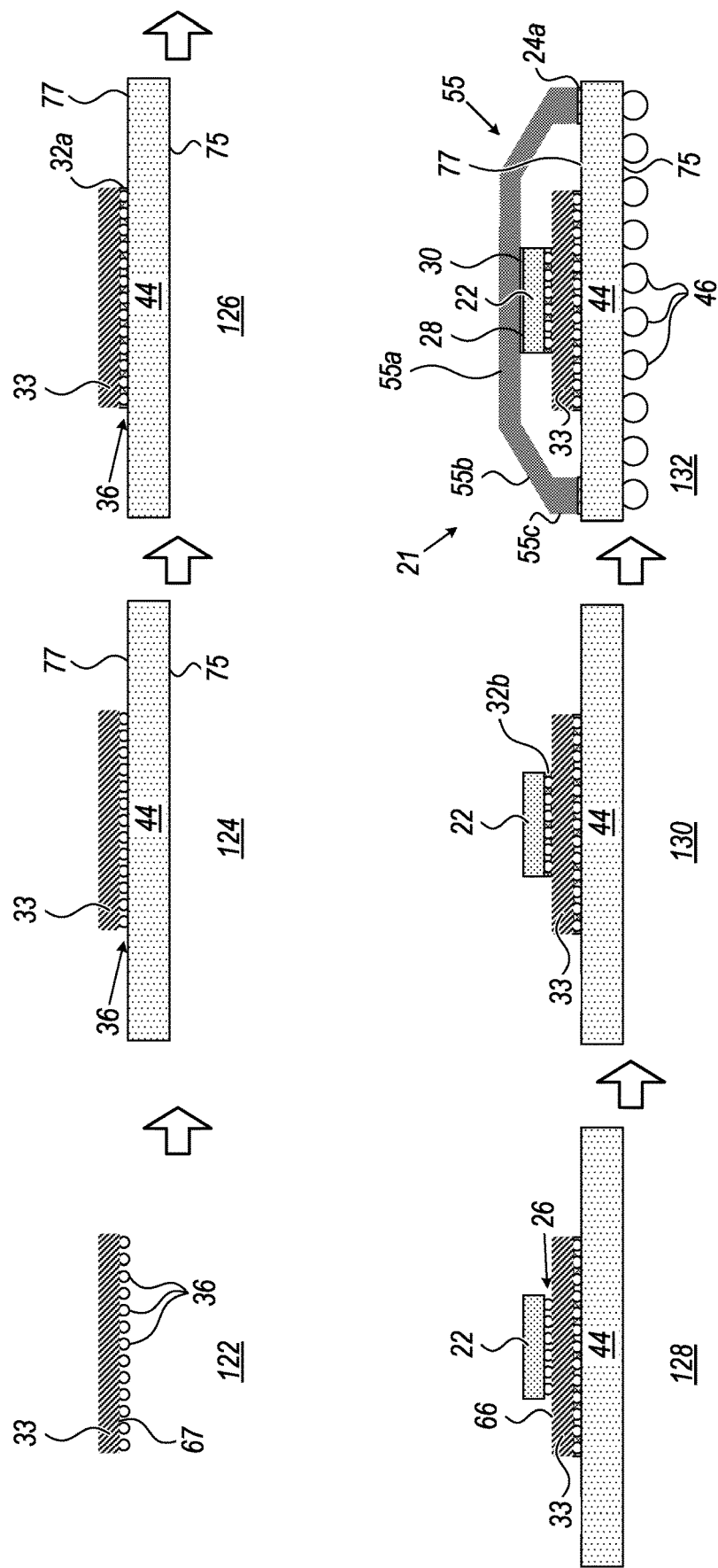
FIG. 4 is a diagram that schematically illustrates a sectional view of a process sequence for packaging the electronic device of FIG. 2, in accordance with another embodiment that is described herein.

FIG. 4 is a diagram that schematically illustrates a sectional view of a process sequence for packaging electronic device 21, in accordance with another embodiment that is described herein.

At an operation 122 solder bumps 36 are formed on surface 67 of interposer 33, as described in operation 106 of FIG. 3 above. At an operation 124 solder bumps 36 are coupled to surface 77 of substrate 44, as described in operation 108 of FIG. 3 above. At an operation 126, layer 32a whose functionality and material composition are described in FIG. 1 above, is disposed between solder bumps 36 and also between interposer 33 and substrate 44, as described in operation 110 of FIG. 3 above.

At an operation 128, IC 22 and copper bumps 26 are coupled to surface 66 of interposer 33, as described in operation 100 of FIG. 3 above. At an operation 130, layer 32b, whose functionality and material composition are described in FIG. 1 above, is disposed between IC 22 and interposer 33, as also described in step 102 of FIG. 3 above. At an operation 132 that concludes the process sequence of FIG. 4, section 55a of lid 55 is coupled to surface 28 (shown in FIG. 1 above) of IC 22 using TIM 30, and section 55c of lid 55 is coupled to surface 77 of substrate 44 using layer 24a. The coupling of lid 55 can be performed using several optional process flows, such as the processes that are described in step 112 of FIG. 3 above excluding the operations related to stiffener structure 88 (which is excluded from the process of FIG. 4). Moreover, balls 46 of the BGA are coupled to surface 75 of substrate 44, as described in FIG. 1 above.

Note that in the process sequence of FIG. 4 interposer 33 and substrate 44 are attached together, and subsequently, IC 22 is coupled thereto, whereas in the process sequence of FIG. 3, IC 22 and interposer 33 are attached together, and subsequently, substrate 44 is coupled thereto. Moreover, the attachment of lid 55 and balls 46 are carried out at the last operation of both FIGS. 3 and 4, but differ from one another because stiffening structure 88 is produced only in electronic device 11, and therefore, lid 55 is not coupled thereto in the process sequence of FIG. 4.

In some embodiments, the process sequence of FIG. 4 may produce less stress than in the process sequence of FIG. 3 above. The lower stress may induce less distortion in interposer 33, compared to the potential distortion that may occur in the process sequence of FIG. 3 above. Therefore, stiffening structure 88, which is not required in the configuration of electronic device 21, is not produced in the process sequence depicted in FIG. 4.

The process sequences of FIGS. 3 and 4 are simplified for the sake of clarity and are shown by way of example in order to illustrate certain problems that are addressed by embodiments of the present invention. Embodiments of the present invention, however, are by no means limited to this specific sort of example process sequences, and the principles described herein may similarly be applied to other sorts of process sequences for packaging electronic and/or electro-optic devices.

Figures 5, 6:
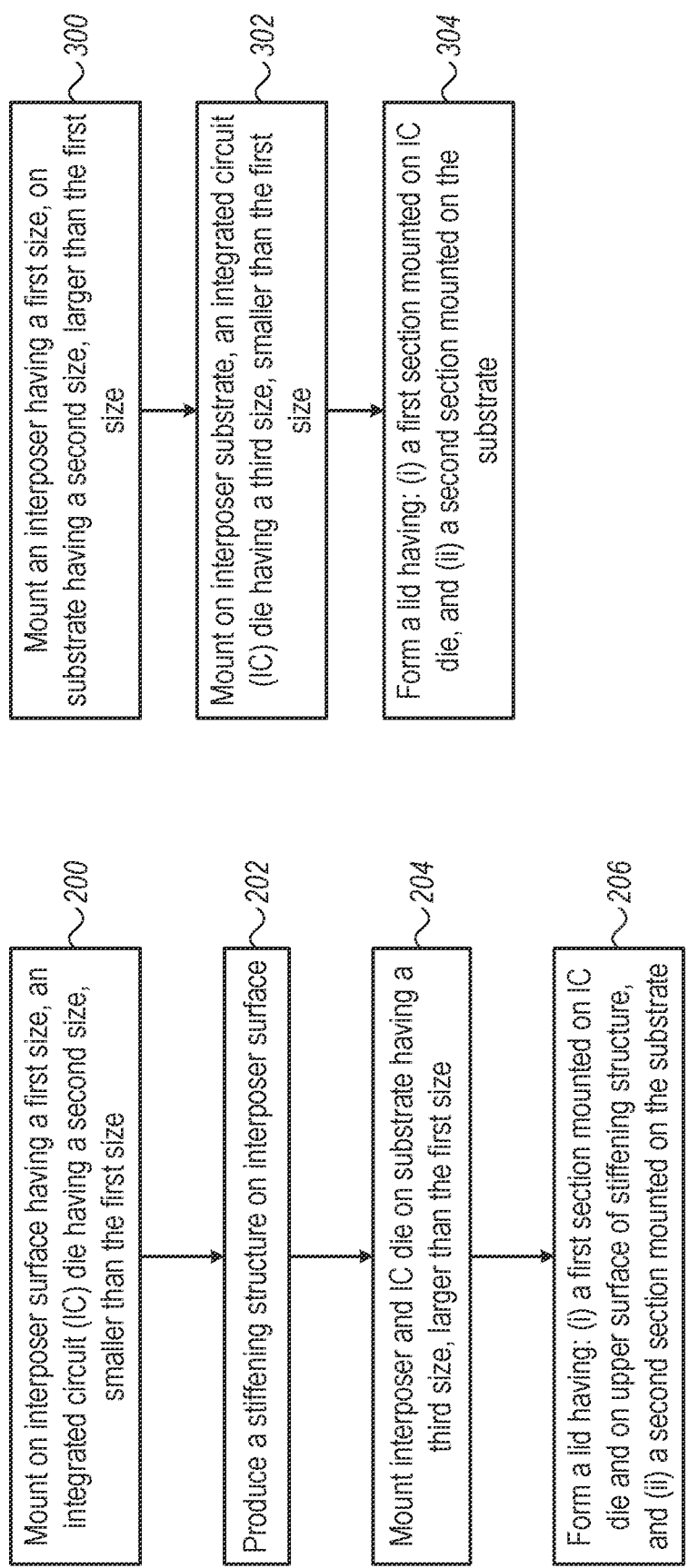
FIG. 5 is a flow chart that schematically illustrates a method for packaging the electronic device of FIG. 1, in accordance with an embodiment that is described herein.
FIG. 6 is a flow chart that schematically illustrates a method for packaging the electronic device of FIG. 2, in accordance with another embodiment that is described herein.

FIG. 5 is a flow chart that schematically illustrates a method for packaging electronic device 11, in accordance with an embodiment that is described herein.

The method begins at an IC die mounting operation 200, with mounting on surface 66 of interposer 33 that has size 35 (e.g., about 50 mm by 50 mm), IC 22 having size 25 (e.g., about 30 mm by 30 mm) smaller than size 35 of interposer 33. In some embodiments, copper bumps 26 having pitch size of about 130 µm are produced over the active surface of IC 22 before operation 200 and are coupled to copper traces 79 and 79a that were patterned in interposer 33 before operation 200. Operation 200 corresponds to operations 100 and 102 of FIG. 3 above, and the detailed structure of electronic device 11 is described in detail in FIG. 1 above.

At a stiffener fabrication operation 202 that corresponds to operation 104 of FIG. 3 above, stiffening structure 88 is produced on surface 66 of interposer 33. Moreover, as shown in operation 106 of FIG. 3 above, solder bumps 36 are coupled to surface 67 of interposer 33 in a process that forms, in the array of solder bumps 36, a pitch size between about 400 µm and 500 µm.

At an interposer and IC die mounting operation 204 that corresponds to operations 108 and 110 of FIG. 3 above, the stack of interposer 33 and IC 22 is mounted on substrate 44 having size 45, which is larger than sizes 25 and 35. Note that copper vias 98 and copper traces 99 and 99a have been patterned within the bulk of, and on surface 77 of substrate 44, and solder bumps 36, 36a and 36b are coupled to respective copper traces 99 and 99a of substrate 44, as described in FIG. 1 above.

At a lid formation and coupling operation 206 that concludes the method, section 55a of lid 55 is mounted on surface 28 of IC 22 and on the surface of stiffening structure 88. Note that (i) TIM 30 and (ii) layer 24b are used for coupling between section 55a and (i) IC 22 and stiffening structure 88. Moreover, section 55c is coupled to surface 77 of substrate 44 using layer 24a, as described in detail in FIG. 1 and in operation 112 of FIG. 3 above.

FIG. 6 is a flow chart that schematically illustrates a method for packaging electronic device 21, in accordance with another embodiment that is described herein. The method begins at an interposer mounting operation 300 that corresponds to operations 122-126 of FIG. 4 above. In some embodiments, solder bumps 36 are coupled to surface 67 of interposer 33, subsequently, interposer 33 and solder bumps 26 are coupled to surface 77 of substrate 44, and layer 32a is disposed between interposer 33 and substrate 44, as also described in detail in FIG. 1 above.

At an IC die mounting operation 302 that corresponds to operations 128 and 130 of FIG. 4 above, IC 22 and copper bumps 26 are coupled to surface 66 of interposer 33, and layer 32b is disposed between IC 22 and interposer 33, as also described in FIG. 1 above.

At a lid formation and coupling operation 304 that concludes the method, section 55a of lid 55 is mounted on surface 28 of IC 22 using TIM 30. Moreover, section 55c is coupled to surface 77 of substrate 44 using layer 24a, as described in detail in FIG. 1 and in operation 132 of FIG. 4 above.

Note that, in an embodiment: (i) copper vias 98 and copper traces 99 and 99a have been patterned in advance within the bulk of substrate 44, and on surface 77, e.g., during the formation of substrate 44 or before coupling to interposer 33, and (ii) copper vias 78, and traces 79 and 79a have been patterned in advance within the bulk of interposer 33, and on surface 66, e.g., during the formation of interposer 33 or before the mounting of IC 22 on interposer 33.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. An electronic device disposed in a package, the package comprising:
   an interposer, having: (i) a first size and a first surface upon which die terminals are disposed and are configured to electrically couple to an integrated circuit die, and (ii) a second surface upon which substrate terminals are disposed and are configured to electrically couple to a package substrate, wherein the integrated circuit die has a second size that is smaller than the first size, wherein the integrated circuit die is mounted on the first surface of the interposer in an electrical contact with the die terminals, wherein the interposer is mounted on a third surface of the package substrate, and wherein the package substrate has a third size, that is larger than the first size;

a fan-out interconnect formed at least partly in the interposer and configured to establish an electrical interconnection between the die terminals on the first surface and the substrate terminals on the second surface, wherein the die terminals have a first pitch size and the substrate terminals have a second pitch size, which is larger than the first pitch size;

a lid, having: (i) a first section, which is configured to abut at least a fourth surface of the integrated circuit die when the lid is mounted, and (ii) a second section, which is mounted on the third surface of the package substrate;

a stiffening structure configured to reduce a first warpage of the interposer, the stiffening structure disposed between the interposer and the lid, the stiffening structure is configured to surround the integrated circuit die so as to be spaced apart from the integrated circuit die, wherein the stiffening structure is configured to mechanically couple the interposer and the lid to reduce a second warpage of the package substrate, and wherein the stiffening structure in conjunction with the lid are configured to create a unified package in which both the interposer and the package substrate are stiffened by an inter connected multipart structure comprising the stiffening structure and the lid;

a layer of thermal interface material (TIM) at least partly overlaying the integrated circuit die and configured to transfer heat from the integrated circuit die to the lid, the TIM is configured to establish thermal contact between the fourth surface and the first section; and an adhesive layer, separate from the TIM, which is configured to couple the stiffening structure to the lid and being disposed between a fifth surface of the stiffening structure and the first section of the lid.

2. The electronic device according to claim 1, wherein the interposer comprises an Ajinomoto build-up film (ABF) substrate, and one or more vias formed through the ABF substrate and configured to electrically connect between the integrated circuit die and the package substrate.

3. The electronic device according to claim 1, wherein the lid comprises copper, which is plated with a layer of nickel, and is configured to spread heat that is generated when powering the integrated circuit die.

4. The electronic device according to claim 1, wherein the lid has a third section connecting between the first and second sections.

5. The electronic device according to claim 4, wherein the third section has a linear shape, and wherein a circumference of the package has a trapezoid-shaped cross-section.

6. The electronic device according to claim 1, wherein the stiffening structure is configured to mechanically couple the interposer and the lid to mechanically stiffen the package.

7. The electronic device according to claim 1, wherein the stiffening structure surrounds the integrated circuit die.

8. The electronic device according to claim 1, and comprising an additional fan-out interconnect establishing an electrical interconnection between the substrate terminals on the second surface and the third surface of the package substrate.

9. The electronic device according to claim 1, wherein the TIM has a first thickness, and the adhesive layer is different from the TIM and has a second thickness, different from the first thickness.

10. A method for packaging an electronic device, the method comprising:

mounting an integrated circuit die on an interposer having: (i) a first size and a first surface upon which die terminals are disposed for electrically coupling to the integrated circuit die, and (ii) a second surface upon which substrate terminals are disposed for electrically coupling to a package substrate, wherein the integrated circuit die has a second size that is smaller than the first size, wherein the integrated circuit die is mounted on the first surface s of the interposer in an electrical contact with the die terminals, wherein the interposer is mounted on a third surface of the package substrate, and wherein the package substrate has a third size, that is larger than the first size;

fabricating a lid, having: (i) a first section, for abutting at least a fourth surface of the integrated circuit die when the lid is mounted, and (ii) a second section, which is mounted on the third surface of the package substrate;

disposing, between the interposer and the lid, a stiffening structure that surrounds the integrated circuit die for reducing a first warpage of the interposer, wherein the stiffening structure is spaced apart from the integrated circuit die and is mechanically coupling between the interposer and the lid to reduce a second warpage of the package substrate, and creating by the stiffening structure in conjunction with the lid, a unified package in which both the interposer and the package substrate are stiffened by an inter connected multipart structure comprising the stiffening structure and the lid;

disposing, between the first section and the fourth surface, a layer of thermal interface material (TIM) to establish contact between the first section and the fourth surface, and to transfer heat between the integrated circuit die and the first section; and disposing, between a fifth surface of the stiffening structure and the first section of the lid, an adhesive layer that is separate from the TIM, for coupling the stiffening structure to the lid.

11. The method according to claim 10, and comprising producing, at least partly in the interposer, a fan-out interconnect for establishing an electrical interconnection between: (i) the die terminals on the first surface, and (ii) the substrate terminals on the second surface, wherein the die terminals have a first pitch size and the substrate terminals have a second pitch size, which is larger than the first pitch size.

12. The method according to claim 10, wherein fabricating the lid comprises producing a third section of the lid for connecting between the first and second sections.

13. The method according to claim 12, wherein the third section has a linear shape, and wherein a circumference of the package has a trapezoid-shaped cross-section.

14. The method according to claim 10, wherein the stiffening structure is disposed between the interposer and the lid to perform mechanical stiffening of the package.

15. The method according to claim 10, wherein disposing the stiffening structure comprises disposing the stiffening structure around the integrated circuit die.

16. The method according to claim 10, and comprising producing an additional fan-out interconnect for establishing an electrical interconnection between (i) the substrate terminals on the second surface, and (ii) the third surface of the package substrate.

17. The method according to claim 10, wherein disposing the TIM comprises disposing a first thickness of the TIM, and disposing the adhesive layer comprises disposing a second thickness of the adhesive layer, different from the first thickness, and wherein the adhesive layer is different from the TIM.

* * * * *